(12) United States Patent
Senzaki et al.

(10) Patent No.: US 6,616,972 B1
(45) Date of Patent: Sep. 9, 2003

(54) SYNTHESIS OF METAL OXIDE AND OXYNITRIDE

(75) Inventors: Yoshihide Senzaki, Carlsbad, CA (US); Arthur Kenneth Hochberg, Solana Beach, CA (US); Kirk Scott Cuthill, Vista, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/256,933

(22) Filed: Feb. 24, 1999

(51) Int. Cl.$^7$ .............................................. C23C 16/18
(52) U.S. Cl. ........................ 427/255.31; 427/255.394; 438/785
(58) Field of Search ..................... 427/255.31, 255.394; 438/785

(56) References Cited

U.S. PATENT DOCUMENTS

| | | | |
|---|---|---|---|
| 5,248,629 A | | 9/1993 | Muroyama .................... 437/52 |
| 5,677,015 A | * | 10/1997 | Hasegawa |
| 5,820,664 A | * | 10/1998 | Gardiner et al. |

FOREIGN PATENT DOCUMENTS

| | | | |
|---|---|---|---|
| EP | 0869544 | 10/1998 | ......... H01L/21/285 |

OTHER PUBLICATIONS

Tabuchi et al., Japanese Journal of Applied Physics, vol. 30, No. 11B, Nov., 19991, pp. L1974–L1977.*
Chiu et al., Journal of Materials Science Letters, 11, (1992), pp. 96–98.*
Treichel et al. *Adv. Mat. Opt. Elec.* 1992, 1, p. 299–308 (No Month).
Devine, R.A.B. et al. *Appl. Phys. Lett.* 1996, 68, p. 1775–1777 (No Month).
Devine, R.A.B. et al. *Microelec. Eng.* 1997, 36, p. 61–64 (No Month).
Jeon, S.R. et al. *J. Appl. Phys.* 1995, 77, p. 5978–5981 (No Month).
Tabuchi, T. et al. *Jap. J. Appl. Phys.* 1991, 30, p. L1974–L1977 (No Month).
Laviale, D. *Appl. Phys. Lett.* 1994, 65, p. 2021–2023 (No Month).
Nagahori et al. *J. Am. Ceram. Soc.* 1995, 78, p. 1585–1592 (No Month).
Kim, I. et al. *J. Mat. Res. Soc.* 1995, 10, p. 2864–2869 (No Month).
Aoyama, T. et al. *J. Electrochem. Soc.* 1996, 143, p. 977–983 (No Month).
Fix, et. al., Chemical Vapor Deposition of Vanadium, Niobium and Tantalum Nitride Thin Films, Chem. Mater., vol. 5, (1993) pp. 614–619 (No Month).
Tsai, et. al., Metalorganic Chemical Vapor Deposition Of Tantalum Nitride By Tertbutylimidotris(Diethylamido)Tantalum For Advanced Metallization, Appl. Phys. Lett. 67, (8) Aug. 1995, pp. 1128–1130.
Chiu, et. al., Syntheses and Characterization of Organoimido Complexes of Tantalum; Potential Single–Source Precursors to Tantalum Nitride, Polyhedran, vol. 17, Nos. 13–14, (1998) pp. 2187–2190 (No Month).
Chiu, et. al., Deposition of Tantalum Nitride Thin Films From Ethylimidotantalum Complex, J. Mat. Sci. Lett, vol. 11, (1992) pp. 96–98 (No Month).
Jun et al., Low Temperature Deposition of TaCN Films Using Pentakis(diethylamido)tantalum, Jpn. J. Appl. Phys. , vol. 37, (1998), pp. L30–L32 (No Month).
Chiu, et. al., Deposition of Molybdenum Carbonitride Thin Films From Mo(NBu$^t$)$_2$(NHBu$^t$)$_2$, J. Mater. Res., vol. 9, No. 7, (Jul. 1994), pp. 1622–1624.
Chiu, et. al., Tungsten Nitride Thin Films Prepared by MOCVD, J. Mater. Res., vol. 8, No. 6, (Jun. 1993), pp. 1353–1360.
Chiu, et. al., Syntheses and Characterization of Organoimido Complexes of Niobium(V); Potential CVD Precursors, J. Chin. Chem. Soc., vol. 45, No. 3, (1998), pp. 355–360 (No Month).
Bradley, et al. *Can. J. Chem.* 1962, 40, p. 1355–1360 (No Month).
Takahashi, Y. et al. *Chem. Lett.* 1978, p. 525–528 (No Month).

* cited by examiner

*Primary Examiner*—Timothy Meeks
(74) *Attorney, Agent, or Firm*—Geoffrey L. Chase

(57) ABSTRACT

A method for producing a material selected from the group consisting of metal oxide, metal oxynitride and mixtures thereof on a substrate, comprising; reacting a first reactant selected from the group consisting of $(R^1R^2N)_xM(=NR^3)_y$, $(R^4R^5N)_xM[\eta^2-R^6N=C(R^7)(R^8)]_y$ and mixtures thereof with an oxidant and up to 95 volume percent of a source of nitrogen selected from the group consisting of ammonia, $N_2O$, $NO$, $NO_2$, alkyl amines, $N_2H_2$, alkyl hydrazine, $N_2$ and mixtures thereof, to produce said material on said substrate, where $R^1$, $R^2$, $R^3$, $R^4$, $R^5$, $R^6$, $R^7$ and $R^8$ are individually $C_{1-6}$ alkyl, aryl or hydrogen, M=Ta, Nb, W or Mo or mixtures thereof, and when M=Ta or Nb, x=3 and y=1 and when M=W or Mo, y=x=2.

17 Claims, No Drawings

SYNTHESIS OF METAL OXIDE AND OXYNITRIDE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

Electronic grade metal oxides and oxynitrides have found increasing interest as dielectric films in microelectronic devices. For instance, tantalum oxide ($Ta_2O_5$) has a high dielectric constant (k=22) and is considered a promising material for applications in microelectronics devices as a gate oxide and as a DRAM storage capacitor. For example, Treichel et al. *Adv. Mat. Opt. Elec.* 1992, 1, p.299–308. As the size of integrated circuit devices become increasingly smaller, chemical vapor deposition (CVD) shows a unique advantage over physical vapor deposition (PVD) for device fabrication in terms of excellent step coverage for trench and stack cell structures. For the CVD processing of $Ta_2O_5$ thin films, various precursors have been studied thus far. A liquid precursor is desirable for the ease and reproducibility of precursor delivery. Tantalum halides ($TaX_5$, X=F, Cl), Devine, R. A. B. et al. *Appl. Phys. Lett.* 1996, 68, p.1775–1777, Devine, R. A. B. et al. Microelec. Eng. 1997, 36, p.61–64, Jeon, S. R. et al. *J. Appl. Phys.* 1995, 77, p.5978–5981, suffer from low volatility and difficulty in delivery due to their solid nature. A solid amide complex $Ta(NMe_2)_5$ (pentakis(dimethylamino)tantalum) has been reported to provide $Ta_2O_5$ films by CVD. Tabuchi, T. et al. *Jap. J. Appl. Phys.* 1991, 30, p.L1974–1977. These films, however, contain significant impurities such as carbon and nitrogen. The most commonly studied alkoxide complex $Ta(OEt)_5$ (tantalum pentaethoxide), Laviale, D. *Appl. Phys. Lett.* 1994, 65, p.2021–2023, Nagahori et al. *J. Am. Ceram. Soc.* 1995, 78, p.1585–92, Kim, I. et al. *J. Mat. Res. Soc.* 1995, 10, p.2864–2869, Aoyama, T. et al. *J. Electrochem. Soc.* 1996, 143, p.977–983, is a liquid and has a marginal vapor pressure for CVD applications, and the resulting films contain carbon impurities. Therefore, an alternative liquid precursor which has sufficient volatility and capability to afford pure $Ta_2O_5$ is of keen interest.

U.S. Pat. No. 5,677,015 discloses the preparation of tantalum oxynitride materials from a precursor of $Cp_mTa(N_3)_n$ where Cp is cyclopentadienyl. The reaction can be thermal or plasma CVD. Ammonia, oxygen, ozone, nitrous oxide, hydrazine are used in the reaction. No physical characteristics of the precursors are described in the patent.

U.S. Pat. No. 5,248,629 discloses the preparation of $TaO_xN_y$ films from the reaction of $Ta[N(R)_2]_5$ such as $Ta[N(CH_3)_2]_5$ and $Ta(OCH_3)_5$. $Ta[N(CH_3)_2]_5$ and $Ta(OCH_3)_5$ are both solid at room temperature.

Reactions of various tantalum sources containing alkylamide ligands to produce tantalum nitride or carbonitride are disclosed in Fix, et. al., Chemical Vapor Deposition of Vanadium, Niobium and Tantalum Nitride Thin Films, Chem. Mater., Vol. 5, (1993) pp. 614–619; Tsai, et. al., Metalorganic Chemical Vapor Deposition Of Tantalum Nitride By Tertbutylimidotris(Diethylamido)Tantalum For Advanced Metallization, Appl. Phys. Lett. 67, (8) August 1995, pp. 1128–1130; Chiu, et. al., Syntheses and Characterization of Organoimido Complexes of Tantalum; Potential Single-Source Precursors to Tantalum Nitride, Polyhedran, Vol. 17, Nos. 13–14, (1998) pp. 2187–2190; and Chiu, et. al., Deposition of Tantalum Nitride Thin Films From Ethylimidotantalum Complex, J. Mat. Sci. Lett, Vol. 11, (1992) pp. 96–98. The latter article indicates that some authors have misidentified $Ta(NCH_2CH_3)_5$, when in fact they were using a combination of $[(CH_3CH_2)_2N]_3Ta=NCH_2CH_3$ and $[(CH_3CH_2)_2N]_3Ta[\eta^2-CH_3CH_2N=CH(CH_3)]$. Jun et. al., Low Temperature Deposition of TaCN Films Using Pentakis(diethylamido) tantalum, Jpn. J. Appl. Phys., Vol. 37, (1998), pp.L30–L32, discloses the deposition of the name compounds.

EP 0 869 544 A2 describes the reaction of $[(CH_3CH_2)_2N]_3Ta=NCH_2CH_3$ with ammonia to form tantalum nitride.

Chiu, et. al., Deposition of Molybdenum Carbonitride Thin Films From $Mo(NBu^t)_2(NHBu^t)_2$, J. Mater. Res., Vol. 9, No. 7, (July 1994), pp.1622–1624, describes the CVD deposition of molybdenum carbonitride compounds from the title precursor.

Chiu, et. al., Tungsten Nitride Thin Films Prepared by MOCVD, J. Mater. Res., Vol. 8, No. 6, (June 1993), pp.1353–1360, describes the MOCVD deposition of tungsten nitride compounds from $W(NBu^t)_2(NHBu^t)_2$.

Chiu, et. al., Syntheses and Characterization of Organoimido Complexes of Niobium(V); Potential CVD Precursors, J. Chin. Chem. Soc., Vol. 45, No. 3, (1998), pp. 355–360, describes the multi-step synthesis of (RN)Nb $(NEt_2)_3$ without formation of the cyclic precursor structure typified in the tantalum analog. The niobium compounds are reported to be useful for metal nitrides and carbonitrides.

The problems of the prior art have been overcome by the present invention, by providing an appropriate liquid precursor with an attractive vapor pressure for chemical vapor deposition of tantalum, niobium, molybdenum and tungsten oxide and oxynitride in a thermal process as will be set forth in greater detail below.

BRIEF SUMMARY OF THE INVENTION

The present invention is a method for producing a material selected from the group consisting of a metal oxide, metal oxynitride and mixtures thereof, wherein the metal is tantalum, niobium, molybdenum or tungsten, on a substrate, comprising; reacting a first reactant selected from the group consisting of $(R^1R^2N)_xM(=NR^3)_y$, $(R^4R^5N)_xM[\eta^2-R^6N=C(R^7)(R^8)]_y$ and mixtures thereof with an oxidant and up to 95 volume percent of a source of nitrogen selected from the group consisting of ammonia, $N_2O$, NO, $NO_2$, alkyl amines, $N_2H_2$, alkyl hydrazine, $N_2$ and mixtures thereof, to produce the material on the substrate, where $R^1$, $R^2$, $R^3$, $R^4$, $R^5$, $R^6$, $R^7$ and $R^8$ are individually $C_{1-6}$ alkyl, aryl or hydrogen, M Ta, Nb, W, Mo or mixtures thereof, and when M=Ta or Nb, x=3 and y=1 and when M=W or Mo, y=x=2.

Preferably, the oxidant is selected from the group consisting of oxygen, ozone, water, hydrogen peroxide, nitrous oxide and mixtures thereof.

Preferably, the material is tantalum oxide.

Alternatively, the material is tantalum oxynitride.

Preferably, the first reactant is selected from the group consisting of $[(CH_3CH_2)_2N]_3Ta=NCH_2CH_3$, $[(CH_3CH_2)_2N]_3Ta[\eta^2—CH_3CH_2N=CH(CH_3)]$ and mixtures thereof.

Preferably, the pressure is in the range of 1 mTorr to 760 Torr, more preferably 0.5 to 1.5 Torr.

Preferably, the temperature is in the range of 200° C. to 600° C., more preferably 280° C. to 400° C.

Preferably, the substrate is silicon.

Preferably, the precursor vaporization temperature is in the range of 50° C. to 150° C., more preferably 85° C. to 100° C.

More specifically, the present invention is a chemical vapor deposition method for producing a material selected from the group consisting of tantalum oxide, tantalum oxynitride and mixtures thereof on a silicon substrate comprising reacting a first reactant selected from the group consisting of $[(CH_3CH_2)_2N]_3Ta=NCH_2CH_3$, $[(CH_3CH_2)_2N]_3Ta[\eta^2-CH_3CH_2N=CH(CH_3)]$ and mixtures thereof with an oxidant selected from the group consisting of oxygen, ozone, hydrogen peroxide, water, nitrous oxide and mixtures thereof and up to 95 volume percent of a source of nitrogen selected from the group consisting of ammonia, $N_2O$, NO, $NO_2$, alkyl amines, $N_2H_2$, alkyl hydrazine, $N_2$, and mixtures thereof, to produce the material on the silicon substrate.

Alternatively, more specifically, the present invention is a chemical vapor deposition method for producing tantalum oxide on a silicon substrate comprising reacting a first reactant selected from the group consisting of $[(CH_3CH_2)_2N]_3Ta=NCH_2CH_3$, $[(CH_3CH_2)_2N]_3Ta[\eta^2-CH_3CH_2N=CH(CH_3)]$ and mixtures thereof with an oxidant selected from the group consisting of oxygen, ozone, hydrogen peroxide, water, nitrous oxide and mixtures thereof to produce the tantalum oxide on the silicon substrate.

Alternatively, the present invention is a chemical vapor deposition method for producing a material selected from the group consisting of tungsten oxide, tungsten oxynitride and mixtures thereof on a silicon substrate comprising reacting a first reactant selected from the group consisting of $[(CH_3CH_2)_2N]_2W(=NCH_2CH_3)_2$, $[(CH_3CH_2)_2N]_2W[\eta^2-CH_3CH_2N=CH(CH_3)]_2$ and mixtures thereof with an oxidant selected from the group consisting of oxygen, ozone, hydrogen peroxide, water, nitrous oxide and mixtures thereof and up to 95 volume percent of a source of nitrogen selected from the group consisting of ammonia, $N_2O$ NO, $NO_2$, alkyl amines, $N_2H_2$, alkyl hydrazine, $N_2$ and mixtures thereof, to produce said material on said silicon substrate.

Further, alternatively, the present invention is a chemical vapor deposition method for producing a material selected from the group consisting of molybdenum oxide, molybdenum oxynitride and mixtures thereof on a silicon substrate comprising reacting a first reactant selected from the group consisting of $[(CH_3CH_2)_2N]_2Mo(=NCH_2CH_3)_2$, $[(CH_3CH_2)_2N]_2Mo[\eta^2-CH_3CH_2N=CH(CH_3)]_2$ and mixtures thereof with an oxidant selected from the group consisting of oxygen, ozone, hydrogen peroxide, water, nitrous oxide and mixtures thereof and up to 95 volume percent of a source of nitrogen selected from the group consisting of ammonia, $N_2O$, NO, $NO_2$, alkyl amines, $N_2H_2$, alkyl hydrazine, $N_2$ and mixtures thereof, to produce said material on said silicon substrate.

Alternatively, the present invention is a chemical vapor deposition method for producing a material selected from the group consisting of niobium oxide, niobium oxynitride and mixtures thereof on a silicon substrate comprising reacting a first reactant selected from the group consisting of $[(CH_3CH_2)_2N]_3Nb=NCH_2CH_3$, $[(CH_3CH_2)_2N]_3Nb[\eta_2-CH_3CH_2N=CH(CH_3)]$ and mixtures thereof with an oxidant selected from the group consisting of oxygen, ozone, water, nitrous oxide and mixtures thereof and up to 95 volume percent of a source of nitrogen selected from the group consisting of ammonia, $N_2O$, NO, $NO_2$, alkyl amines, $N_2H_2$, alkyl hydrazine, $N_2$ and mixtures thereof, to produce said material on said silicon substrate.

The present invention is also a method for producing a mixed metal compound on a substrate comprising: (1) a material selected from the group consisting of a metal oxide, metal oxynitride and mixtures thereof, wherein the metal is tantalum, niobium, molybdenum or tungsten, formed by reacting a first reactant selected from the group consisting of $(R_1R^2N)_xM(=NR^3)_y$, $(R^4R^5N)_xM[\eta^2-R^6N=C(R^7)(R^8)]_y$ and mixtures thereof with an oxidant and up to 95 volume percent of a source of nitrogen selected from the group consisting of ammonia, $N_2O$, NO, $NO_2$, alkyl amines, $N_2H_2$, alkyl hydrazine, $N_2$ and mixtures thereof, to produce said material on said substrate, where $R^1$, $R^2$, $R_3$, $R^4$, $R^5$, $R^6$, $R^7$ and $R^8$ are individually $C_{1-6}$ alkyl, aryl or hydrogen, M=Ta, Nb, W, Mo or mixtures thereof, and when M=Ta or Nb, x=3 and y=1 and when M=W or Mo, y=x=2; and (2) one or more additional metals or metal compounds other than tantalum, niobium, molybdenum or tungsten formed by decomposing a precursor of such one or more additional metals on the substrate.

Preferably, the precursor of the additional metal is selected from the group consisting of metal alkyls, metal alkoxides, metal halides, metal hydrides, metal amides, metal azides, metal cyclopentadienyls, metal carbonyls, metal β-diketonates metal β-ketoiminates, metal β-diiminates, and their fluorine substituted analogs and mixtures thereof.

More preferably, the precursor of the additional metal is co-deposited with the first reactant.

BRIEF DESCRIPTION OF SEVERAL VIEWS OF THE DRAWINGS

Not Applicable

DETAILED DESCRIPTION OF THE INVENTION

Metal oxides and oxynitrides such as tantalum oxide and tantalum oxynitride have become increasingly important to the microelectronics fabrication industry for high k dielectric materials of construction. Tantalum oxide, $Ta_2O_5$, is used as a high specific dielectric constant capacitance insulating film.

The present invention uses as the metal oxide or oxynitride precursor one or more of, and preferably a combination of, $(R^1R^2N)_xM(=NR^3)_y$, $(R^4R^5N)_xM[\eta^2-R^6N=C(R^7)(R^8)]_y$ and mixtures thereof with an oxidant to produce the material on the substrate, where $R^1$, $R^2$, $R^3$, $R^4$, $R^5$, $R^6$, $R^7$ and $R^8$ are individually $C_{1-6}$ alkyl, aryl or hydrogen, but preferably only $R^8$ is hydrogen, M=Ta, Nb, W, Mo, or mixtures thereof and when M=Ta or Nb, x=3 and y=1 and when M=W or Mo, y=x=2. For the oxynitride, 0 to 95 percent of a source of nitrogen selected from the group consisting of ammonia, $N_2O$, NO, $NO_2$, alkyl amines, $N_2H_2$, alkyl hydrazine, $N_2$ and mixtures thereof, can be used to adjust the nitride content of the oxynitride. Specifically in a preferred embodiment, the present invention uses $[(CH_3CH_2)_2N]_3Ta=NCH_2CH_3$ and $[(CH_3CH_2)_2N]_3Ta[\eta-CH_3CH_2N=CH(CH_3)]$ where the latter compound has the structure:

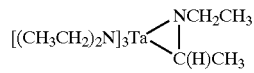

The present invention, in a preferred embodiment, offers a low cost, high performance precursor for tantalum oxide and oxynitride without the need to convert any $[(CH_3CH_2)_2N]_3Ta[\eta^2-CH_3CH_2N=CH(CH_3)]$ to $[(CH_3CH_2)_2N]_3Ta=NCH_2CH_3$.

The process of making the metal oxide or oxynitride material layer on a substrate such as silicon, silicon dioxide or metallization patterns involves vaporizing or entraining the liquid, $(R^1R^2N)_xM(=NR^3)_y$ and/or $(R^4R^5N)_xM[\eta^2-R^6N=C(R^7)(R^8)]_y$ in a carrier gas, as helium, nitrogen or argon to an appropriate reactor for chemical vapor deposition, such as a cold wall reactor, and reacting the entrained precursor vapor with an oxidant, such as oxygen, ozone, hydrogen peroxide, water or nitrous oxide and potentially a source of nitrogen selected from the group consisting of ammonia, $N_2O$, NO, $NO_2$, alkyl amines, $N_2H_2$, alkyl hydrazine, $N_2$ and mixtures thereof, of at temperatures in the range of 200° C. to 600° C., preferably 280° C. to 400° C. and a pressure of 1 mTorr to 760 Torr, preferably 0.5 to 1.5 Torr and reactant flow rates of 1 standard cubic centimeters per minute (sccm) to 100 sccm. The ratio of $(R^1R^2N)_xM(=NR^3)_y$ to $(R^4R^5N)_xM[\eta^2-R^6N=C(R^7)(R^8)]_y$ is in the range of 0 to 100 % and the volume ratio of reactant to oxidant is 0.05 to 1. In a preferred embodiment, the tantalum oxide formed is $Ta_2O_5$, while the tantalum oxynitride is $Ta_rO_sN_t$, where r+s+t=1, 0.1<s <0.9 and 0.1 <t <0.9. The tantalum oxide film characteristics are an amorphous structure as deposited with a deposition rate of over 100 angstroms per minute, and polycrystalline structure with low carbon incorporation of less than 5 atomic % and nitrogen incorporation below detection limit after annealing under oxygen at 800° C. for 30 minutes. Various sources of nitrogen, such as nitrogen oxides, maybe added as a reactant to enhance the ratio of nitrogen in the oxynitride films.

In addition to thermal CVD, the films of the present invention can be deposited by plasma or photo enhanced deposition, a well recognized deposition technique, or by atomic layer epitaxy, a process well documented in the art. In atomic layer epitaxy, an approximately single layer of precursor molecules are adsorbed on a surface. Second reactant is dosed onto the first precursor layer followed by a reaction between the precursor and the reactant on the surface. This alternating procedure is repeated to provide the desired thickness of element or compound in a near atomic thickness layer.

Typically, $[(CH_3CH_2)_2N]_3Ta=NCH_2CH_3$ and $[(CH_3CH_2)_2N]_3Ta[\eta^2-CH_3CH_2N=CH(CH_3)]$ are synthesized from $TaCl_5$ and 5 $LiNCH_2CH_3$ as well set forth in the literature.

In addition to depositing a metal oxide or oxynitride from the group of metals comprising tantalum, niobium, tungsten and molybdenum, the present invention can also be used as a part of a process to deposit a mixed metal compound layer, such as depositing strontium, bismuth and tantalum oxide (SBT) from a mixture of precursors or precursor solutions of those metals, referred to in the industry as a cocktail, or by delivering several precursors or precursor solutions individually and mixing the precursor vapors into a reactor chamber. Typical mixed metal compound layers include; $SrBi_2Ta_2O_9$, $Pb(Sc, Ta)O_3$, and $SrBi_2(Ta,Nb)_2O_9$. In such a process, the tantalum, niobium, tungsten or molybdenum metal would be delivered from the class of precursors described in the present invention while the metals other than tantalum, niobium, tungsten and molybdenum, would be delivered from traditional precursors for such other metals. These traditional precursors include; metal alkyls, cyclopentadienyls, carbonyls, alkoxides, halides, hydrides, amides, azides, β-diketonates, β-ketoiminates, β-diiminates, and their fluorine substituted analogs. For instance, the metal alkyl would be represented by the formula $MR_x$ where M is the metal and x is the valence of the metal. R would be a reasonable length branched, cyclic, or normal alkyl or aryl group, typically $C_{1-6}$. Metal cyclopentadienyls would be typified by the formula $M(C_5H_5)_n$ where M is the appropriate metal and n is the valence of the metal. Metal carbonyls are typified by iron pentacarbonyl $Fe(CO)_5$. Metal alkoxides are typified by titanium isopropoxide, $Ti(i-C_3H_7O)_4$. Metal halides are typified by titanium tetrachloride, $TiCl_4$. Metal hydrides are typified by trimethylaminogallane $[(CH_3)_3N]GaH_3$. Metal amides are typified by titanium tetrakis (dimethylamide), $Ti[N(CH_3)_2]_4$. Metal azides are typified by diethyl aluminum azide $[(CH_3CH_2)_2Al(N_3)]_3$. The β-diketonates are typified by Ba bis(2,2,6,6-tetramethyl-3,5-heptanedionate). The β-ketoiminates are typified by copper N-methyl-2-imino-4-pentanonate, $Cu(CH_3C(NCH_3)CHC(O)CH_3)_2$. The β-diiminates are typified by copper bis-N, N-dimethyl-2,4-pentadiiminate $Cu(CH_3C(NCH_3)CHC(NCH_3)CH_3)_2$. For example, the fluorine substituted β-diketonate complex would be typified by $Cu(hfac)_2$ where hfac=hexafluoroacetylacetonate.

In the present invention, a known liquid complex, $[(CH_3CH_2)_2N]_3Ta=NCH_2CH_3$ and $[(CH_3CH_2)_2N]_3Ta[\eta^2-CH_3CH_2N=CH(CH_3)]$ was found to be a promising candidate precursor for the CVD of pure tantalum oxide using oxygen or water vapor as a reactant gas, as will be set forth in the examples below. In addition, $[(CH_3CH_2)_2N]_3Ta=NCH_2CH_3$ and $[(CH_3CH_2)_2N]_3Ta[\eta^2-CH_3CH_2N=CH(CH_3)]$ affords pure tantalum oxynitride films using nitrous oxide as an additional reactant gas. $[(CH_3CH_2)_2N]_3Ta=NCH_2CH_3$ and $[(CH_3CH_2)_2N]_3Ta[\eta^2-CH_3CH_2N=CH(CH_3)]$ can be easily synthesized ($TaCl_5$+5 $LiNEt_2$) with an isolated yield of over 60% according to the literature method: Bradley, et al. *Can. J. Chem.* 1962, 40, p.1355–1360; Takahashi, Y. et al. *Chem. Lett.* 1978, p.525–528. $[(CH_3CH_2)_2N]_3Ta=NCH_2CH_3$ and $[(CH_3CH_2)_2N]_3Ta[\eta^2-CH_3{}_{CH2}N=CH(CH_3)]$ provide sufficient volatility (higher than that of previously studied $Ta(OCH_2CH_3)_5$ precursor) and thermal stability for CVD applications. The following examples support the present invention.

EXAMPLE 1

CVD of Tantalum Oxide Using $O_2$ Gas

Tantalum oxide was deposited on a 4-inch diam. silicon wafer using a warm-wall low pressure chemical vapor deposition (LPCVD) system at a chamber pressure of 2 Torr using $[(CH_3CH_2)_2N]3Ta=NCH_2CH_3$ and $[(CH_3CH_2)_2N]_3Ta[\eta^2-CH_3CH_2N=CH(CH_3)]$. The precursor container and delivery lines were heated to 85° C. and 90° C., respectively. A Si(100) substrate was heated to 360–380° C. A flow of 40 standard cubic centimeters/minute (sccm) of $O_2$ gas was introduced into the chamber. The precursor was delivered to the chamber with a helium carrier gas flow of 200 sccm. After 10 min of deposition, a reflective blue thin film (thickness ca. 1400 A) was obtained. The refractive index, 2.3, of the film measured by ellipsometry was comparable to the literature value of 2.0–2.2. The energy dispersive X-ray (EDX) analysis demonstrated that the deposited film consists of tantalum and oxygen with no detectable impurities such as carbon or nitrogen. X-ray diffraction (XRD) analysis revealed that films were amorphous as deposited and that the films annealed at 800° C. under oxygen were polycrystalline hexagonal $Ta_2O_5$. Auger electron spectroscopy (AES) analysis of the annealed sample demonstrated that O/Ta=2.5, less than 5 atomic % of carbon incorporation, and nitrogen was below detection limit.

EXAMPLE 2

CVD of Tantalum Oxide Using $H_2O$ Vapor

Tantalum oxide was also deposited using 4 to 6 sccm of water vapor in place of $O_2$ gas, using the procedure of the Example 1. The infrared spectra and refractive index showed that the films were similar to those using $O_2$ as a reactant gas. The refractive index decreased below 2.0 as water vapor was increased. X-ray diffraction (XRD) analysis revealed that films were amorphous as deposited and that the films annealed at 800° C. under oxygen were polycrystalline hexagonal $Ta_2O_5$.

EXAMPLE 3

CVD of Tantalum Oxide Using Direct Liquid Injection

Tantalum oxide was deposited on a 4-inch diam. silicon wafer using a warm-wall low pressure chemical vapor deposition (LPCVD) reactor equipped with a direct liquid injection system (liquid pump/vaporizer/shower head) at a chamber pressure of 0.5–2.0 Torr using $[(CH_3CH_2)_2 N]_3Ta$=$NCH_2CH_3$ and $[(CH_3CH_2)_2N]_3Ta[\eta_2$—$CH_3CH_2N$=$CH(CH_3)]$. The precursor was delivered into the vaporizer at 25° C. at a flow rate of 5.5 sccm and vaporized at 90° C. The precursor vapor was delivered to the chamber with a helium carrier gas flow of 100 sccm: A flow of 40 sccm of $O_2$ gas was introduced into the chamber. Si(100) substrates were heated to 270–340° C. After 3–20 min of deposition, thin films with high uniformity (standard deviation less than 6%) were obtained. The refractive index, 2.1–2.2, of the films measured by ellipsometry were comparable to the literature value of 2.0–2.2. The apparent activation energy is estimated to be 22kcal/mol.

EXAMPLE 4

CVD of Tantalum Oxynitride Using Direct Liquid Injection

Tantalum oxynitride was deposited on a 4-inch diam. silicon wafer using a warm-wall low pressure chemical vapor deposition (LPCVD) reactor equipped with a direct liquid injection system (liquid pump/vaporizer/shower head) at a chamber pressure of 0.5–2.0Torr using $[(CH_3CH_2)_2 N]_3Ta$=$NCH_2CH_3$ and $[(CH_3CH_2)_2N]_3Ta[\eta_2$—$CH_3CH_2N$=$(CH(CH_3)]$. $CH_3CH_2N$=$CH(CH_3)]$. The precursor was delivered into the vaporizer at 25° C. at a flow rate of 5 sccm and vaporized at 90° C. The precursor vapor was delivered to the chamber with a helium carrier gas flow of 100 sccm. A flow of 60 sccm of $N_2O$ gas was introduced into the chamber. Si(100) substrates were heated to 270–340° C. The deposition rate was 70 angstroms/min at the substrate temperature of 320° C. The refractive index of the films were 2.1–2.8 measured by ellipsometry. Ta, O, N were detected by EDX but no carbon was detected.

EXAMPLE 5

CVD of Tantalum Nitride Using Ammonia

Tantalum nitride was deposited on a 4-inch diam. silicon wafer using a warm-wall LPCVD system at a chamber pressure of 1.5 Torr using $[(CH_3CH_2)_2N]_3Ta$=$NCH_2CH_3$ and $[(CH_3CH_2)_2N]_3Ta[\eta^2$—$CH_3CH_2N$=$CH(CH_3)]$. The precursor container and delivery were heated to 85° C. and 99° C., respectively. A Si(100) substrate was heated to 384° C. 30 ccm of $NH_3$ gas was introduced into the chamber. The precursor was delivered to the chamber with a nitrogen carrier gas flow of 150 sccm. After 10 min of deposition, a non-reflective gray thin film was obtained. The EDX analysis demonstrated that the deposited film consist of tantalum and nitrogen with no detectable impurities such as carbon or oxygen. XRD analysis showed that as-deposited films were cubic TaN with marginal crystallinity. Annealing at 500° C. under nitrogen for 30 min. enhanced the crystallinity.

The process of the present invention using $(R^1R^2N)_xM$ $(=NR^3)_y$, and $(R^4R^5N)_xM[\eta^2$—$R^6N$=$C(R^7)(R^8)]_y$, in combination without the added step of purifying the former compound from the latter compound or without converting the latter compound to the former compound, provides a simple, inexpensive process for preparing high purity metal oxide and oxynitride in a form where the precursor is easily delivered to the reaction site or the substrate to be treated due to the high vapor pressure property of the liquid precursor. The state of low viscous liquid phase of the precursor enables a use of a direct liquid injection method, which provides precise and reproducible control of precursor delivery. In addition, the present combination precursor results in tantalum oxide and oxynitride films and plugs with minimal carbon incorporation and other defects and provides good conformal coverage of various nonplanar surfaces as are found in multilayer electronic device structures presently fabricated and envisioned by the electronics industry.

The present invention has been set forth with regard to several preferred embodiments, but the full scope of the present invention should be ascertained from the claims which follow.

What is claimed is:

1. A method for producing a material selected from the group consisting of a metal oxynitride and mixtures thereof, wherein the metal is tantalum, niobium, molybdenum or tungsten, on a substrate, comprising; reacting a first reactant selected from the group consisting of $(R^1R^2N)_xM(=NR^3)_y$, $(R^4R^5N)_xM(\eta^2$—$R^6N$=$C(R^7)(R^8)_y$ and mixtures thereof with an oxidant and up to 95 volume percent of a source of nitrogen selected from the group consisting of ammonia, $N_2O$, NO, $NO_2$, alkyl amines, $N_2H_2$, alkyl hydrazine, $N_2$ and mixtures thereof, to produce said material on said substrate, where $R^1$, $R^2$, $R^3$, $R^4$, $R^5$, $R^6$, $R^7$ and $R^8$ are individually areyl $C_{1-6}$ alkyl or hydrogen, M=Ta, Nb, W, Mo or mixtures thereof, and when M=Ta or Nb, x=3 and y=1 and when M=W or Mo, y=x=2.

2. The method of claim 1 wherein said oxidant is selected from the group consisting of oxygen, ozone, water, hydrogen peroxide, nitrous oxide and mixtures thereof.

3. The method of claim 1 wherein said material is a metal oxide.

4. The method of claim 1 wherein said material is a metal oxynitride.

5. The method of claim 1 wherein said first reactant is selected from the group consisting of $(CH_3CH_2)_2 N)_3Ta$=$NCH_2CH_3$, $(CH_3CH_{22}N)_3Ta(\eta^2$—$CH_3CH_2N$=$CH (CH_3)$ and mixtures thereof.

6. The method of claim 1 including a pressure in the range of 1 mTdrr to 760 Torr.

7. The method of claim 1 including a temperature in the range of 200° C. to 600° C.

8. The method of claim 1 wherein said substrate is silicon.

9. The method of claim 1 wherein said first reactant is a mixture of $(R^1R^2N)_3M$=$NR^3$ and $(R^4R^5N)_3Ta(\eta^2$—$R^6N$=$C(R^7)(R^8)$.

10. The method of claim 1 wherein the precursor vaporization temperature is in the range of 50° C. to 150° C.

11. A chemical vapor deposition method for producing a material selected from the group consisting of tantalum oxide, tantalum oxynitride and mixtures thereof on a silicon substrate comprising reacting a first reactant selected from the group consisting of $((CH_3CH_2)_2N)_3Ta=NCH_2CH_3$, $((CH_3CH_2)_2N)_3Ta(\eta^2-CH_3CH_2N=CH(CH_3))$ and mixtures thereof with an oxidant selected from the group consisting of oxygen, ozone, water, hydrogen peroxide, nitrous oxide and mixtures thereof and up to 95 volume percent of a source of nitrogen selected from the group consisting of ammonia, $N_2O$, NO, $NO_2$, alkyl amines, $N_2H_2$, alkyl, hydrazine, $N_2$ and mixtures thereof, to produce said material on said silicon substrate.

12. The method of claim 11 wherein said first reactant is a mixture of $((CH_3CH_2)_2N)_3Ta=NCH_2CH_3$ and $((CH_3CH_2)_2N)_3Ta(\eta^2-CH_3CH_2N=CH(CH_3))$.

13. A chemical vapor deposition method for producing tantalum oxide on a silicon substrate comprising reacting a first reactant selected from the group consisting of $((CH_3CH_2)_2N)_3Ta=NCH_2CH_3$, $((CH_3CH_2)_2N)_3Ta(T\eta^2-CH_3CH_2N=CH_3))$ thereof with an oxidant selected from the group consisting of oxygen, ozone, water, hydrogen peroxide, nitrous oxide and mixtures thereof to produce said tantalum oxide on said silicon substrate.

14. The method of claim 13 wherein said first reactant is a mixture of $((CH_3CH_2)_2N)_3Ta=NCH_2CH_3$ and $((CH_3CH_2)_2N)_3Ta(\eta^2-CH_3CH_2N=CH(CH_3))$.

15. A method for producing a mixed metal compound on a substrate comprising: (1) a material selected from the group consisting of a metal oxide, metal oxynitride and mixtures thereof, wherein the metal is tantalum, niobium, molybdenum or tungsten, formed by reacting a first reactant selected from the group consisting of $(R^1R^2N)_xM(=NR^3)_y$, $(R^4R^5N)_xM(\eta^2-R^6N=C(R^7)(R^8))_y$ and mixtures thereof with an oxidant and up to 95 volume percent of a source of nitrogen selected from the group consisting of ammonia, $N_2O$, NO, $NO_2$, alkyl amines, $N_2H_2$, alkyl hydrazine, $N_2$ and mixtures thereof, to produce said material on said substrate, where $R^1, R^2, R^3, R^4, R^5, R^6, R^7$ and $R^8$ are individually aryl $C_{1-6}$ alkyl, aryl or hydrogen, M=Ta, Nb, W, Mo or mixtures thereof, and when M=Ta or Nb, x=3 and y=1 and when M=W or Mo, y=x=2; and (2) one or more additional metals or metal compounds other than tantalum, niobium, molybdenum or tungsten formed by decomposing a precursor of such one or more additional metals on said substrate.

16. The method of claim 15 wherein said precursor of said additional metal is selected from the group consisting of metal alkyls, metal alkoxides, metal cyclopentadienyls, metal carbonyls, metal halides, metal hydrides, metal amides, metal azides, metal β-diketonates, metal β-ketoiminates, metal β-diiminates, fluorine substituted analogs of the numbers of the Markush group and mixtures thereof.

17. The method of claim 16 wherein said precursor of said additional metal is co-deposited with said first reactant.

\* \* \* \* \*